(12) United States Patent
Freer

(10) Patent No.: US 7,476,876 B2
(45) Date of Patent: Jan. 13, 2009

(54) ION BEAM ANGLE MEASUREMENT SYSTEMS AND METHODS EMPLOYING VARIED ANGLE SLOT ARRAYS FOR ION IMPLANTATION SYSTEMS

(75) Inventor: Brian S. Freer, Medford, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 339 days.

(21) Appl. No.: 11/313,319

(22) Filed: Dec. 21, 2005

(65) Prior Publication Data

US 2007/0138412 A1    Jun. 21, 2007

(51) Int. Cl.
*H05G 2/00* (2006.01)
*H05H 1/00* (2006.01)
*H05H 1/24* (2006.01)

(52) U.S. Cl. ............... 250/492.21; 250/396 R; 250/397; 250/492.3

(58) Field of Classification Search ............ 250/492.21, 250/396 R, 397, 398, 400, 491.1, 492.2, 492.22, 250/492.23, 492.3
See application file for complete search history.

(56) References Cited

U.S. PATENT DOCUMENTS

| | | | |
|---|---|---|---|
| 3,778,626 | A | 12/1973 | Robertson |
| 4,276,477 | A | 6/1981 | Enge |
| 4,745,287 | A | 5/1988 | Turner |
| 5,483,077 | A | 1/1996 | Glavish |
| 5,760,405 | A * | 6/1998 | King et al. ............. 250/423 R |
| 5,825,038 | A * | 10/1998 | Blake et al. ............ 250/492.21 |
| 6,777,695 | B2 | 8/2004 | Viviani |
| 6,828,572 | B2 | 12/2004 | Reece et al. |
| 6,872,953 | B1 | 3/2005 | Benveniste |
| 7,202,483 | B2 | 4/2007 | Olson et al. |
| 2003/0197132 | A1 * | 10/2003 | Keum et al. ............ 250/492.21 |
| 2004/0195528 | A1 | 10/2004 | Reece et al. |
| 2005/0082498 | A1 * | 4/2005 | White .................... 250/492.21 |
| 2005/0211924 | A1 * | 9/2005 | Shibata et al. ......... 250/492.21 |

(Continued)

FOREIGN PATENT DOCUMENTS

JP    2003-229087 A    8/2003

(Continued)

OTHER PUBLICATIONS

"The Extrion 220 Parallel Scan Magnet", R.E. Kaim and P.F.H.M. Van Der Meulen, Nuclear Instruments and Methods in Physics Research B55, Section B, Beam Interactions with Materials and Atoms, Elsevier, Amsterdam, NL, vol. B55, No. ¼, Apr. 2, 1991, pp. 453-456.

(Continued)

*Primary Examiner*—Bernard E Souw
(74) *Attorney, Agent, or Firm*—Eschweiler & Associates, LLC

(57) ABSTRACT

An angle measurement system for measuring angles of incidence for ion beams during ion implantation includes a varied angle slot array and an array of charge measurement devices located downstream of the varied angle slot array. The varied angle slot array includes slots formed within a structure from an entrance surface to an exit surface. Each of the slots has a varied acceptance angle range. The array of charge measurement devices are individually associated with the slots and can measure charge or beam current for beamlets that pass through the slots. These measurements and the varied or different acceptance angle ranges can then be employed to determine a measured angle of incidence and/or angular content for an ion beam.

25 Claims, 12 Drawing Sheets

U.S. PATENT DOCUMENTS

| | | | |
|---|---|---|---|
| 2005/0247889 A1* | 11/2005 | Yoon .......................... | 250/491.1 |
| 2005/0253098 A1* | 11/2005 | Petersen et al. ................. | 251/4 |
| 2006/0113493 A1* | 6/2006 | Kabasawa et al. ...... | 250/492.21 |
| 2006/0113494 A1* | 6/2006 | Chen et al. ............. | 250/492.21 |
| 2006/0219936 A1* | 10/2006 | Olson et al. .................. | 250/397 |
| 2006/0289798 A1* | 12/2006 | Cummings et al. ...... | 250/492.21 |
| 2007/0138412 A1* | 6/2007 | Freer ...................... | 250/492.21 |
| 2007/0145298 A1* | 6/2007 | Freer et al. ............. | 250/492.21 |

OTHER PUBLICATIONS

"In Situ Beam Angle Measurement in a Multi-Wafer High Current Ion Implanter", B.S. Freer, R.N. Reece, M.A. Graf, T. Parrill and D. Polner, Nuclear Instruments & Methods in Physics Research, Section B: Beam Interactions with Materials and Atoms, Elsevier, Amsterdam, NL, vol. 237, No. 1-2, Aug. 2005, 6 pgs.

"In-Situ Ion Beam Profiling by Fast Scan Sampling", P. Splinter, F. Sinclair, N. Demario, W. Reed, J. Castintini, D. Shen, J. Burgess and P. Ring, Ion Implantation Technology, Proceedings of the 11th International Conference on Austin, TX, Jun. 1996, pp. 272-275.

International Search Report, Int'l Application No. PCT/US2006/048937, Int'l Filing Date Dec. 20, 2006, 3 pgs.

International Search Report dated Dec. 12, 2006 for Application No. PCT/US2006/047330.

Office Action dated Jan. 30, 2008 for U.S. Appl. No. 11/299,593.

Response filed Apr. 30, 2008 for U.S. Appl. No. 11/299,593.

\* cited by examiner

ION BEAM ANGLE MEASUREMENT SYSTEMS AND METHODS EMPLOYING VARIED ANGLE SLOT ARRAYS FOR ION IMPLANTATION SYSTEMS

FIELD OF INVENTION

The present invention relates generally to semiconductor device fabrication and ion implantation, and more particularly, to calibrating, detecting and/or modifying an ion beam incident angle, directionally, during setup or in situ.

BACKGROUND OF THE INVENTION

Ion implantation is a physical process that is employed in semiconductor device fabrication to selectively implant dopant into semiconductor and/or wafer material. Thus, the act of implanting does not rely on a chemical interaction between a dopant and semiconductor material. For ion implantation, dopant atoms/molecules are ionized, accelerated, formed into a beam, analyzed, and swept across a wafer, or the wafer is swept through the beam. The dopant ions physically bombard the wafer, enter the surface and come to rest below the surface, at a depth related to their energy.

An ion implantation system is a collection of sophisticated subsystems, each performing a specific action on the dopant ions. Dopant elements, in gas or solid form, are positioned inside an ionization chamber and ionized by a suitable ionization process. In one exemplary process, the chamber is maintained at a low pressure (vacuum). A filament is located within the chamber and is heated to the point where electrons are created from the filament source. The negatively charged electrons are attracted to an oppositely charged anode also within the chamber. During the travel from the filament to the anode, the electrons collide with the dopant source elements (e.g., molecules or atoms) and create a host of positively charged ions from the elements in the molecule.

Generally, other positive ions are created in addition to desired dopant ions. The desired dopant ions are selected from the ions by a process referred to as analyzing, mass analyzing, selection, or ion separation. Selection is accomplished utilizing a mass analyzer that creates a magnetic field through which ions from the ionization chamber travel. The ions leave the ionization chamber at relatively high speeds and are bent into an arc by the magnetic field. The radius of the arc is dictated by the mass of individual ions, speed, and the strength of the magnetic field. An exit of the analyzer permits only one species of ions, the desired dopant ions, to exit the mass analyzer.

An acceleration system is employed to accelerate or decelerate the desired dopant ions to a predetermined momentum (e.g., mass of an dopant ion multiplied by its velocity) to penetrate the wafer surface. For acceleration, the system is generally of a linear design with annular powered electrodes along its axis. As the dopant ions enter therein, they are accelerated there through.

Subsequently, the accelerated ions within the beam are directed toward a target wafer or location. The ion beam strikes the target with an actual angle of incidence, which is typically measured in one or two dimensions from normal. This actual angle can vary from a desired or selected angle of implantation.

If a calibration error or angular error is present (e.g., process equipment is not calibrated properly) the ion implantation can be performed at a different angle, location and/or depth than intended. Such errors can undesirably modify the implantation profile, fail to dope certain areas, implant dopants into unintended areas, damage device structures, dope to an incorrect depth, and the like. Additionally, as device dimensions continue to be reduced, this angular alignment becomes even more important.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention facilitates semiconductor device fabrication by detecting or measuring angle of incidence values for incident ion beams and optionally correcting angular errors before and/or during ion implantation procedures. The present invention employs varied angle slot arrays comprised of structures having a plurality of slots defined therein. The slot arrays select one or more beamlets from ion beams according to varied acceptance angles. Charge measurement sensors, such as pickup sensors, measure charge or beam current associated with each of the slots of the array. From these measurements and acceptance angles for each of the slots, an angle of incidence value for the ion beam can be obtained.

In accordance with an aspect of the present invention, an angle measurement system is disclosed. The system is employed for measuring angles of incidence for ion beams during ion implantation comprises a varied angle slot array and an array of charge measurement devices located downstream of the varied angle slot array. The varied angle slot array includes slots formed within a structure from an entrance surface to an exit surface. Each of the slots has a varied acceptance angle range. The array of charge measurement devices are individually associated with the slots and can measure charge or beam current for beamlets that pass through the slots. These measurements and the varied acceptance angle ranges can then be employed to determine a measured angle of incidence and/or angular content for an ion beam. Other systems, methods, and detectors are also disclosed.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
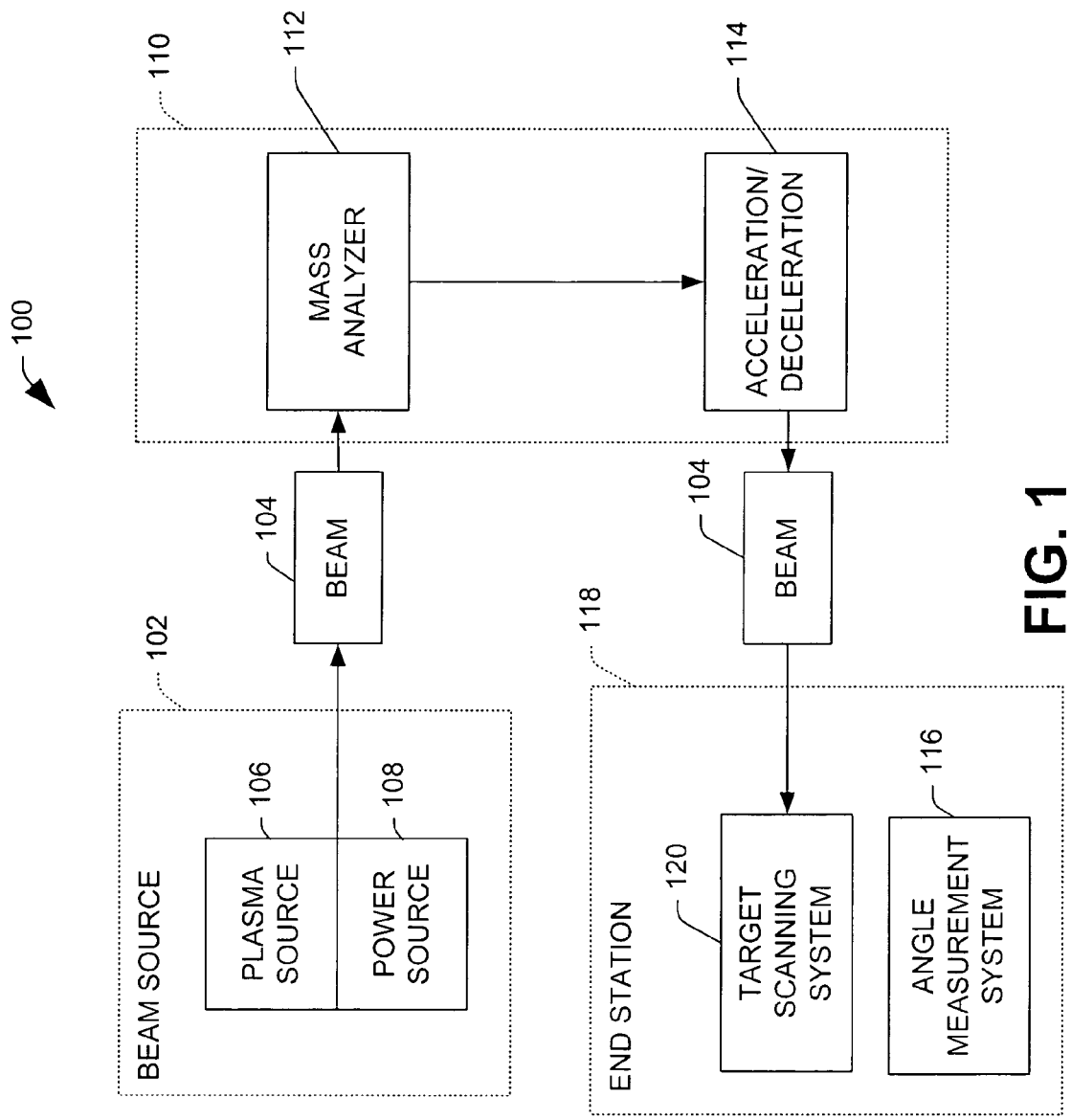
FIG. 1 is an ion implantation system suitable for implementing one or more aspects of the present invention in block diagram form.

The present invention will now be described with reference to the attached drawings, wherein like reference numerals are used to refer to like elements throughout. It will be appreciated by those skilled in the art that the invention is not limited to the exemplary implementations and aspects illustrated and described hereinafter.

The present invention facilitates semiconductor device fabrication by detecting or measuring angle of incidence values for incident ion beams and optionally correcting angular errors before and/or during ion implantation procedures. The present invention employs varied angle slot arrays comprised of structures having a plurality of slots defined therein. The slot arrays select one or more beamlets from ion beams according to varied acceptance angles. Charge measurement sensors, such as pickup sensors, measure charge or beam current associated with each of the slots of the array. From these measurements and acceptance angles for each of the slots, an angle of incidence value for the ion beam can be obtained.

Referring initially to FIG. 1, an ion implantation system 100 suitable for implementing one or more aspects of the present invention is depicted in block diagram form. The system 100 includes an ion source 102 for producing an ion beam 104 along a beam path. The ion beam source 102 includes, for example, a plasma source 106 with an associated power source 108. The plasma source 106 may, for example, comprise a relatively long plasma confinement chamber from which an ion beam is extracted.

A beam line assembly 110 is provided downstream of the ion source 102 to receive the beam 104 there from. The beam line assembly 110 includes a mass analyzer 112, an acceleration structure 114, which may include, for example, one or more gaps, and an angular energy filter 116. The beam line assembly 110 is situated along the path to receive the beam 104. The mass analyzer 112 includes a field generating component, such as a magnet (not shown), and operates to provide a field across the beam path so as to deflect ions from the ion beam 104 at varying trajectories according to mass (e.g., charge to mass ratio). Ions traveling through the magnetic field experience a force which directs individual ions of a desired mass along the beam path and which deflects ions of undesired mass away from the beam path.

The acceleration gap or gaps within the acceleration structure 114 are operable to accelerate and/or decelerate ions within the beam to achieve a desired depth of implantation in a workpiece. Accordingly, it will be appreciated that while the terms accelerator and/or acceleration gap may be utilized herein in describing one or more aspects of the present invention, such terms are not intended to be construed narrowly so as to be limited to a literal interpretation of acceleration, but are to be construed broadly so as to include, among other things, deceleration as well as changes in direction. It will be further appreciated that acceleration/deceleration means may be applied before as well as after the magnetic analysis by the mass analyzer 112.

An end station 118 is also provided in the system 100 to ion beam 104 from the beamline assembly 110. The end station 118 supports one or more workpieces such as semiconductor wafers (not shown) along the beam path for implantation using the mass analyzed decontaminated ion beam 104. The end station 118 includes a target scanning system 120 for translating or scanning one or more target workpieces and the ion beam 104 relative to one another. The target scanning system 120 may provide for batch or serial implantation, for example, as may be desired under given circumstances, operating parameters and/or objectives.

The end station 118 also includes an angle measurement system 116 that measures angle of incidence values, also referred to as angle alignment, of the ion beam 104. Alternatively, the angle measurement system 116 may be located outside of the endstation, if the angle at the location of the measurement system 116 is representative of the angle in the endstation. The angle measurement system 116 comprises one or more varied angle slot arrays and one or more collectors or pickups that receive current from the slots. The varied angle slot arrays are arrays of slots that have varied angle of acceptance values. The associated charge collectors measure ions or beam current of beamlets that pass through the varied angle slot arrays. The charge collectors or pickups can be biased relative to ground and/or the slots, and insulating surfaces can be placed between adjacent charge collectors or pickups. The charge measurements and known angle of acceptance values are then employed to determine measured or actual angle of incidence values for the ion beam 104.

If variations between the measured angle of incidence values and selected or desired angle of incidence values, also referred to as angular variations, are present, this information can be employed by the end station 118 and/or the beam line assembly 110 to alter or correct the actual angle of incidence values toward the desired or selected angle of incidence value.

Figure 2:
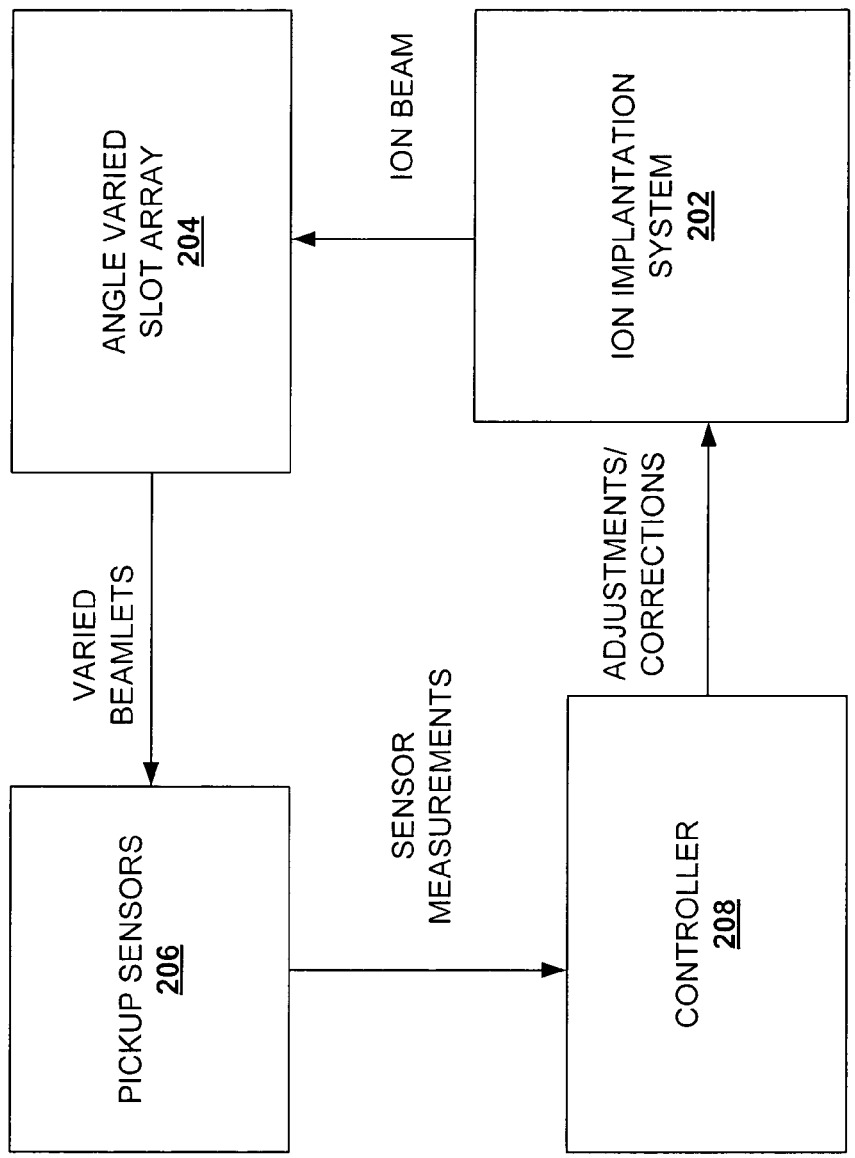
FIG. 2 is a block diagram illustrating an angle measurement system in accordance with an aspect of the present invention.

FIG. 2 is a block diagram illustrating an angle measurement system 200 in accordance with an aspect of the present invention. The system 200 obtains one or more beamlets from an array or plurality of slots having varied acceptance angles. Charge measurements for the beamlets are then obtained and employed along with the varied acceptance angles to determine a measured angle of incidence value.

The system 200 operates on or with an ion implantation system 202 by providing measured angle of incidence values for calibration prior to ion implantation or for corrective adjustments during ion implantation. The ion implantation system 202 generates an ion beam and directs the ion beam toward a target locations, such as a target wafer. The ion implantation system 202 controls various parameters of the implantation process, such as selection dopant(s) or species, beam current, dose, energy, and angle of implant. The ion implantation system 202 can employ the angle measurements from the system 200 to adjust the implant angle toward a desired or selected angle of implant if the measured angle varies from the desired or selected angle of implant.

The system 200 comprises a varied angle slot array 204, pickup sensors 206, and a controller 208. The varied angle slot array 204 is comprised of an array of slots positioned within at least a portion of a path of an ion beam. The slots are formed and/or defined within a structure or mask. Each of the slots within the array 204 has an acceptance angle, which is a range of angles for which ions from the ion beam can pass through the associated slot. Additional examples of varied angle slot arrays are provided below.

The varied angle slot array 204 obtains one or more beamlets from the ion beam. The beamlets have angular components corresponding to the slots through which they pass.

An array of pickup sensors 206 receive the one or more beamlets from the varied angle slot array 204 and measure charge or beam current there from. The sensors 206 are each associated with a slot of the slot array 204. As a result, the presence or absence of measured charge or beam current can be employed to determine a measured angle of incidence.

The pickup sensors 206 may be held at a potential at or near ground, or they may be biased to a positive or negative potential so as to improve or facilitate the accuracy of the desired ion current measurement. Other structures, made of conducting or insulating materials, can be located between the pickup sensors 206 and the varied angle slot array 204, between adjacent pickup sensors, and at other locations near the pickup sensors or near the slot array 204. These additional structures can also be held at a potential at or near ground, or they may be floating or biased at various negative or positive potentials so as to improve or facilitate the accuracy of the desired ion current measurement.

A controller 208 receives the sensor measurements from the pickup sensors 206 and determines a measured angle of incidence value. Adjustments or corrections for the implant process are determined by the controller 208 and then provided to the ion implantation system 202. The sensor measurements, which include beam current measurements, are employed along with the assigned acceptance angles to determine the measured angle of incidence value.

It is noted that the angle measurement system 200 can sample all or only a portion of the ion beam. In some aspects, sampling the entire ion beam may, for example, require moving the pickup sensors 206 and the varied angle slot array 204 through the beam or sweeping the beam through the varied angle slot array 204 and the pickup sensors 206.

As an example, if the slot array 204 and/or the pickup sensors 206 do not span the entire beam, or the portion of the beam of interest, the slot array 204 and/or pickup sensors 206 may be moved individually or separately through the beam in one or more directions, or the beam moved across the slot array and/or pickup sensors in one or more directions, or both. In addition a slot at a given angle may be made up of a single slot or an array of slots at the same angle. A pickup sensor may also be made up of a single sensor for all slots of all angles, all slots of a single angle, or a single slot in an array of slots at a single angle.

Figure 3:
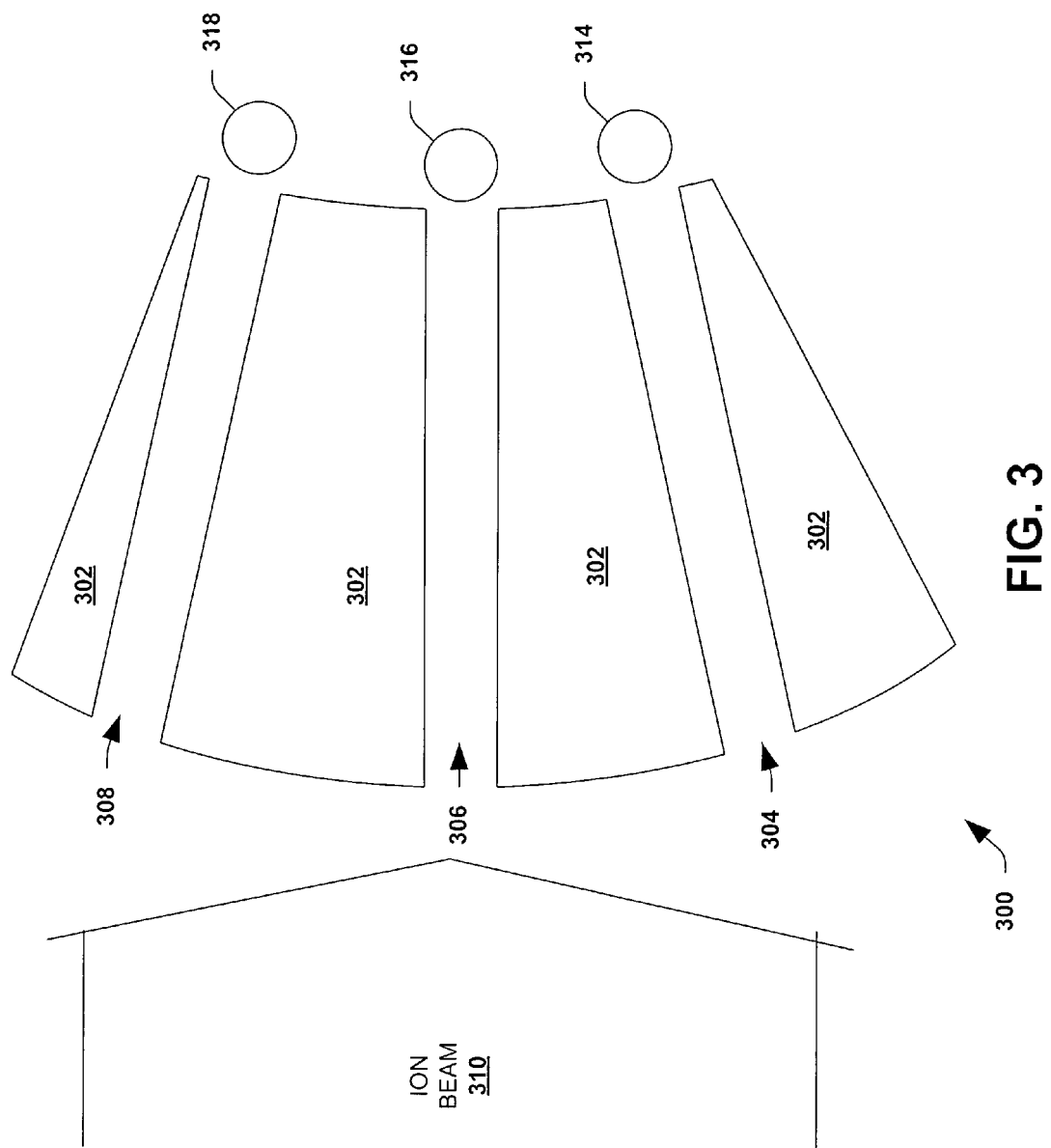
FIG. 3 is a diagram illustrating a portion of a varied angle slot array in accordance with an aspect of the present invention.

FIG. 3 is a diagram illustrating a portion of a varied angle slot array 300 in accordance with an aspect of the present invention. The slot array 300 obtains beamlets according to varied acceptance angles and then measures for charge or beam current.

FIG. 3 is provided to facilitate a better understanding of the present example and is not intended to limit the invention to that described and illustrated in FIG. 3. Additionally, the dimensions are selected for illustrative purposes.

The varied angle slot array 300 comprises a structure 302 with a number of slots, a first slot 304, a second slot 306, and a third slot 308 formed therein. The structure 302 is comprised of a suitable material, such as graphite, aluminum, and the like, has a convex curved surface, in this example, on an entrance side and a concave curved surface, in this example, on an exit side. The slots 304, 306, and 308 are formed with varied acceptance angles, which are ranges of angles from normal through which ions may pass there through.

Pickup sensors, including a first pickup sensor 314, a second pickup sensor 316, and a third pickup sensor 318, measure charge or beam current for beamlets that pass through the slots 304, 306, and 308. The presence or absence of measured beam current or charge by the pickup sensors 314, 316, and 318 can indicate an actual or measured angle of incidence value.

The first slot 304 has a first acceptance angle, for example, of about −3 to −9 degrees. As such, the associated first pickup sensor 314 measures charge for ions within the first acceptance angle range. Similarly, the second slot 306 has a second acceptance angle, for example, of about −3 to +3 degrees. As a result, the second pickup sensor 316 measures charge for ions at angles within the second acceptance angle range. Additionally, the third slot 308 has a third acceptance angle, for example, about +3 to +9 degrees. Consequently, the third pickup sensor 318 measures charge for ions at angles within the third acceptance angle range. It is noted that the slot array 300 can comprise additional slots and pickup sensors (not shown) in order to measure other acceptance angles.

During operation, an ion beam 310 is directed toward a target location (not shown). The slot array 300 is positioned along the path of the ion beam 310, typically near the target location. Depending on an angle of incidence of the ion beam 310, one or more of the sensors will measure charge. In the above example, a perfectly parallel ion beam having an angle of incidence of −6 degrees would register a charge measurement on the first pickup sensor 314.

Alternative combinations of angle acceptance ranges and angular spacing of adjacent slots, resulting in different overlaps of angular acceptance, can be used. For example, if adjacent slots are spaced by one-half of the slot acceptance range, rather than the full slot acceptance as described above, then the charge or beam current measured on the sensor can be used to calculate an angle of incidence to high accuracy. There are other combinations of acceptance ranges and angular spacings that can satisfy different requirements for accuracy and ease of measurement.

Figure 4A:
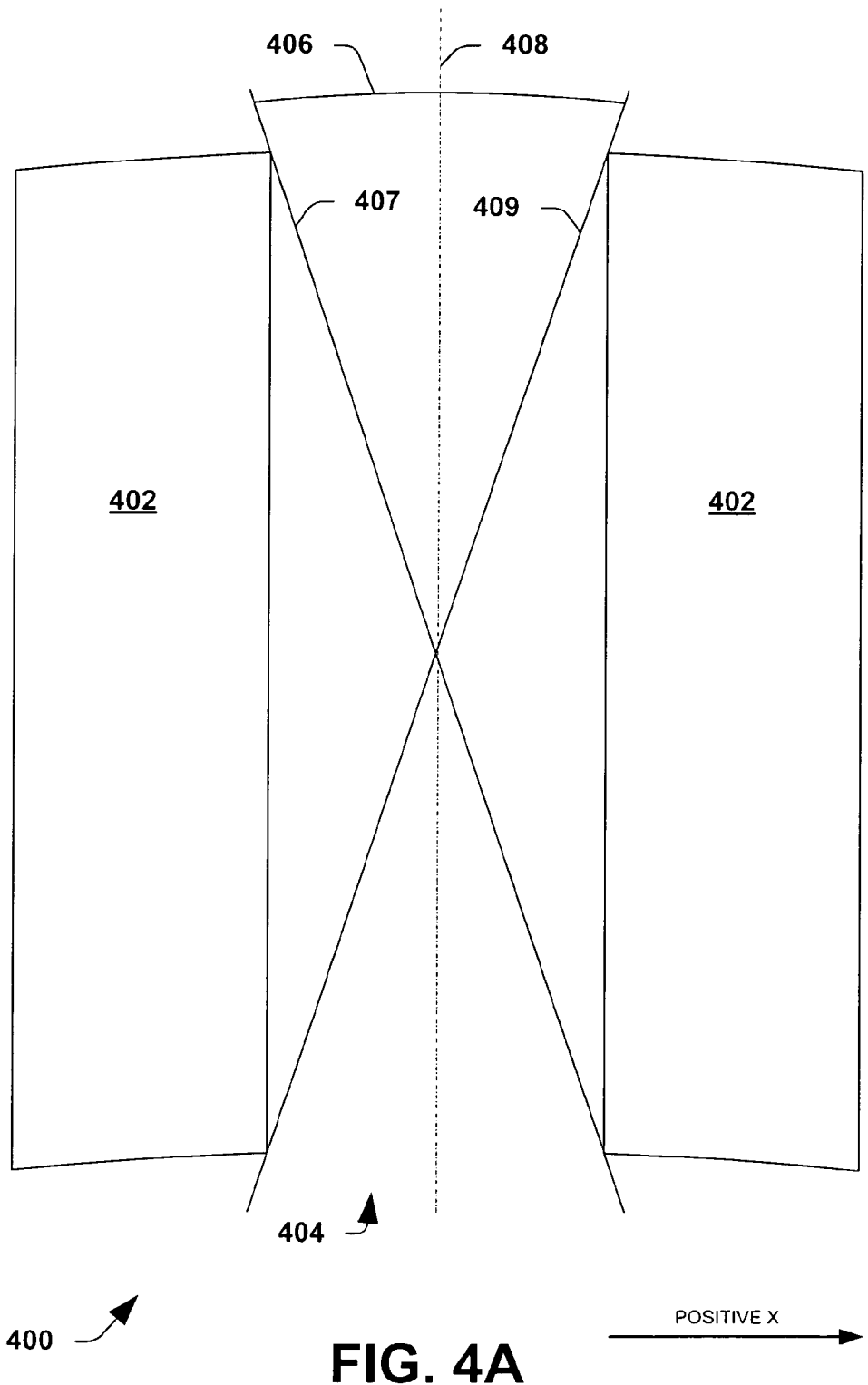
FIGS. 4A and 4B are diagrams illustrating a single slot of a varied angle slot array in accordance with an aspect of the present invention.
Figure 4B:
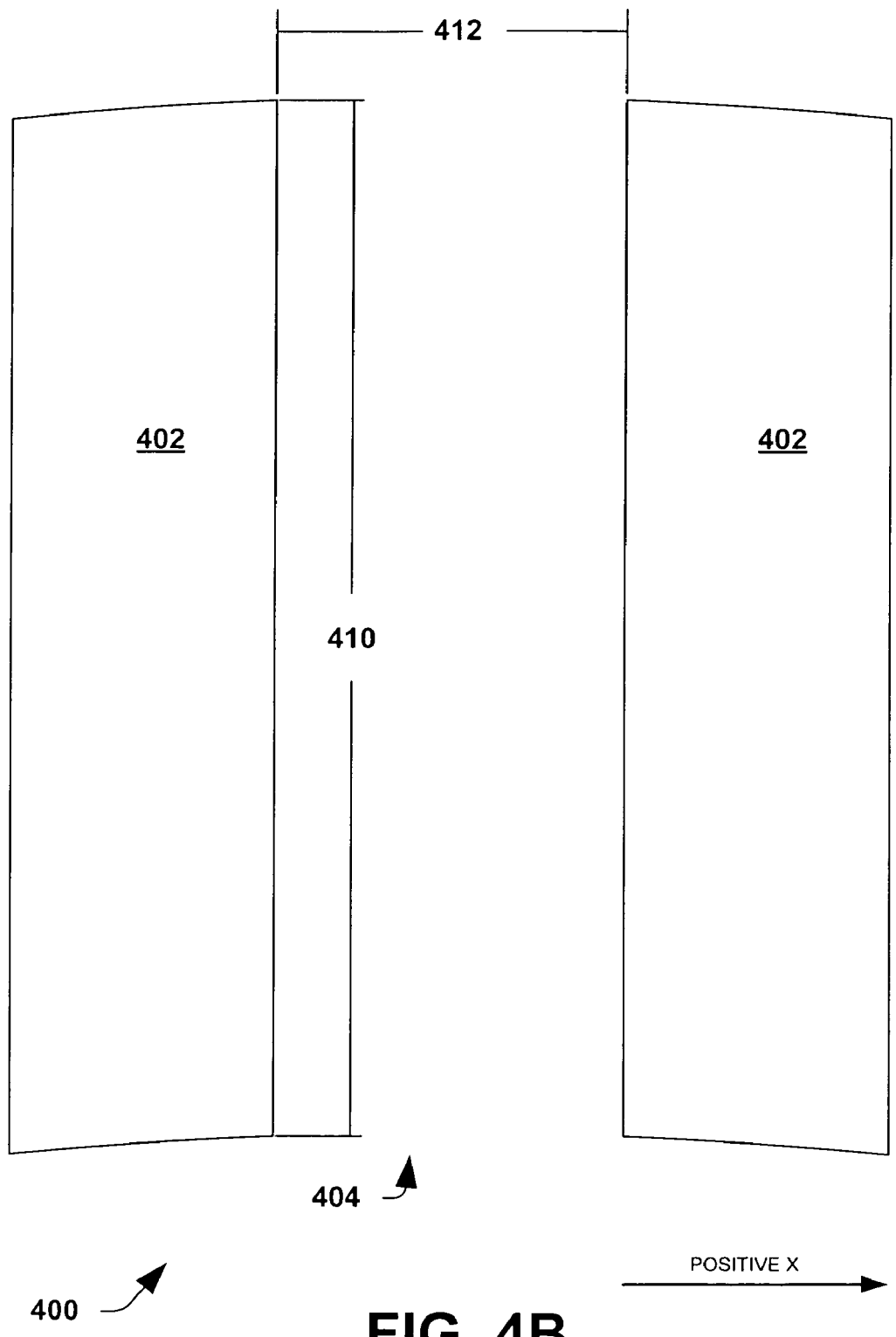

FIGS. 4A and 4B are diagrams illustrating a single slot 404 of a varied angle slot array 400 in accordance with an aspect of the present invention. This diagram is presented for illustrative purposes to illustrate some pertinent characteristics of slots within varied angle slot arrays. The diagram is not intended to limit the invention to that which is shown and described.

The varied angle slot array 400 comprises a structure 402 having an array of slots formed therein. The structure 402 is comprised of a suitable material, such as graphite, such that the structure 402 prevents ions from passing there through. A single slot 404 of the array of slots is shown in FIG. 4A.

FIG. 4A shows an acceptance angle range 406 for the slot 404. The acceptance angle range 406 is a range of angle for which ions traveling with angle of incidence values within that range can pass through the slot 404. Generally, the acceptance angle range 406 is selected such that at least one of the slots of the array of slots will pass at least some ions from an incident ion beam. However, a variety of possible ranges can be employed by various aspects of the present invention.

The acceptance angle range 406 can be defined by a minimum acceptance angle 407 and a maximum acceptance angle 409. A normal axis 408 is shown and typically described as having an angle of zero. The minimum angle 407 is less than zero and the normal axis 408, in this example, and the maximum angle 409 is greater than zero. In this example, the minimum angle 407 and the maximum angle 409 are depicted with similar magnitudes, however the present invention contemplates variations in these values and variations in symmetry.

As an example, the minimum angle 407 could be −3 degrees and the maximum angle 409 could be +3 degrees yielding an acceptance angle range 406 of 6 degrees.

FIG. 4B shows dimensional characteristics for the slot 404. The slot 404 has a width 412 and a height 410 as shown. The height 410 and the width 412 define an aspect ratio and the acceptance angle range 406 for the slot 404. Increasing the height decreases the acceptance angle range 406 and increasing the width 412 increases the acceptance angle range.

Figure 5:
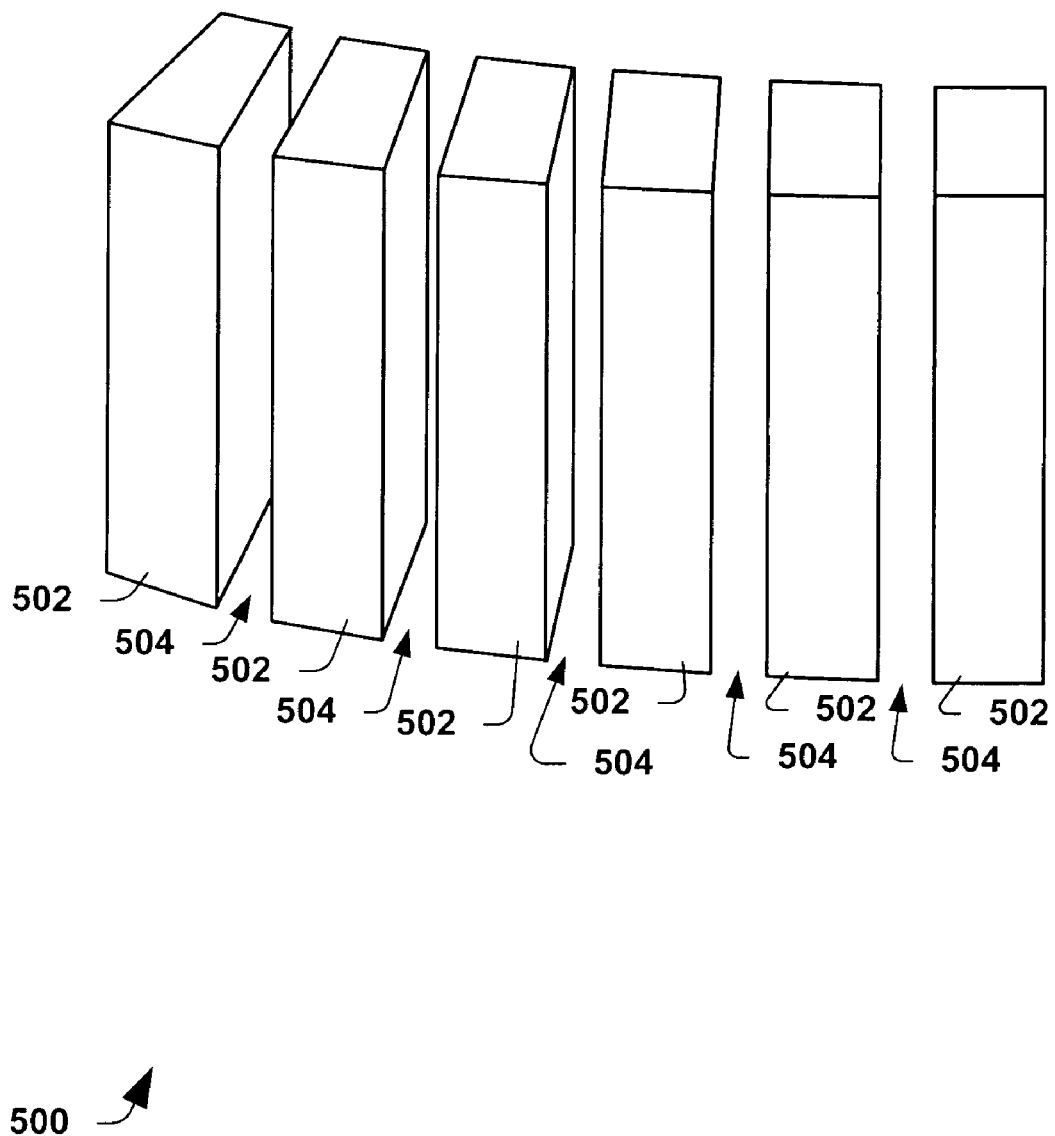
FIG. 5 is a perspective view of a varied angle slot array in accordance with an aspect of the present invention.

FIG. 5 is a perspective view of a varied angle slot array 500 in accordance with an aspect of the present invention. This view is presented for illustrative purposes and as an example of a varied angle slot array in accordance with the present invention.

The slot array 500 is comprised of a structure 502 with an array of varied angle slots 504 formed therein. It can be seen that individual slots have varied acceptance angles from each other. As a result, only ions traveling within particular angles can pass through the particular slots. For example, ions from an ion beam may pass through one or more slots on the right side of the array 500, but be blocked by one or more slots on the left side of the array.

An entrance side is shown having a convex shaped entrance surface through which ions or beamlets from an ion beam initially enter the slots 504. Pickup sensors (not shown) are located downstream from the array 500 in order to measure charge or current, if any, for ions or beamlets that pass through the slots 504.

It is noted that the present invention contemplates varied angle slot arrays having other shapes and structures, so long as slots within such arrays have varied angles.

Figure 6A:
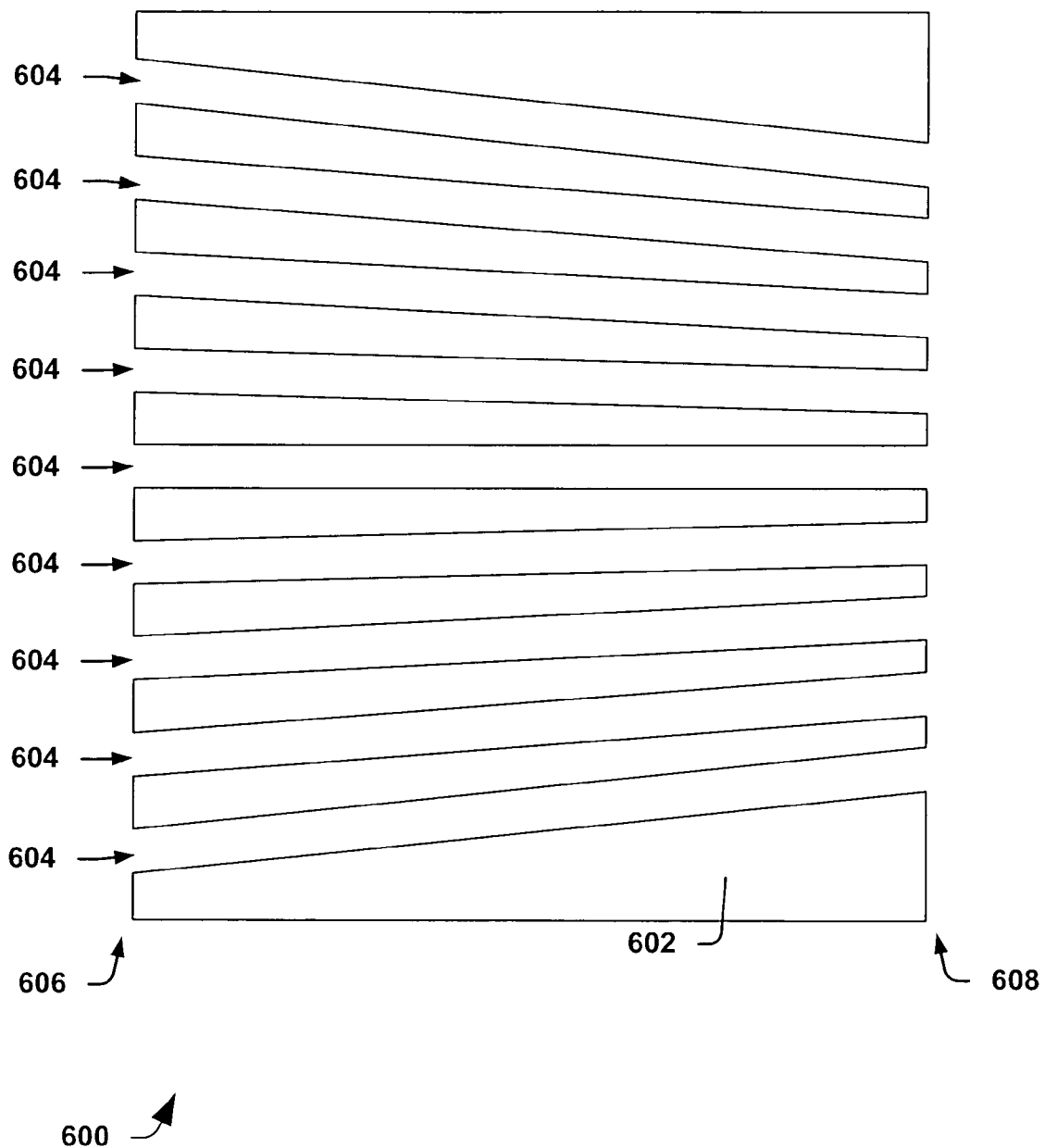
FIG. 6A is a diagram illustrating another varied angle slot array 600 in accordance with an aspect of the present invention.

FIG. 6A is a diagram illustrating another varied angle slot array 600 in accordance with an aspect of the present invention. Here, an entrance surface of the array is relatively flat, yet slots 604 within the array have varied acceptance angles.

The varied angle slot array 600 comprises the varied angled slots 604 formed within a structure 602. An entrance surface 606 of the structure 602 is relatively flat, but the slots 604 are formed therein with varied angles. As a result, the slots 604 have varied acceptance angles. An exit surface 608 is also flat.

During operation, an ion beam (not shown) impacts the varied angle slot array 600 at the entrance surface 606. The ion beam has an angle of incidence value and an angular distribution. Beamlets from the ion beam having suitable angles pass through one or more of the slots 604 and are measured by one or more charge measuring devices (not shown) after passing beyond the exit surface 608.

Figure 6B:
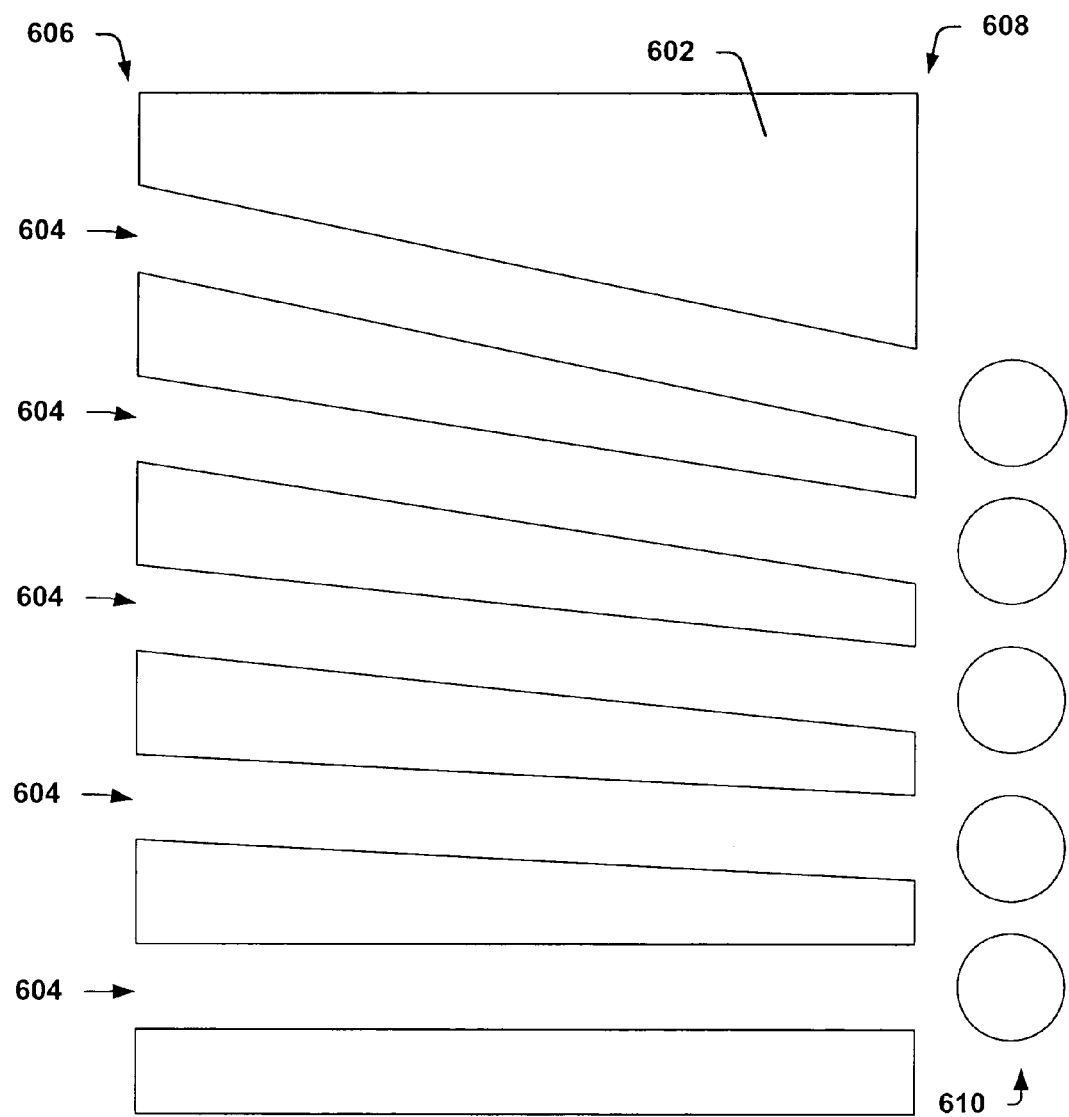
FIG. 6B is a close up view of the varied angle slot array 600 in accordance with an aspect of the present invention.

FIG. 6B is a close up view of the varied angle slot array 600 in accordance with an aspect of the present invention. The view again shows the slots 604 formed within the structure 602. Pickup sensors 610 are also shown in this example to measure beam current or charge for ions that pass through respective slots. The pickup sensors are positioned downstream beyond the exit surface 608.

FIGS. 6A and 6B show an example of another varied angle slot array having varied acceptance angle slots physically formed therein with another shape of the structure and the slots. It is appreciated that other variations in shape of the structure and slots and/or other varied configurations are contemplated by the present invention.

Figure 7A:
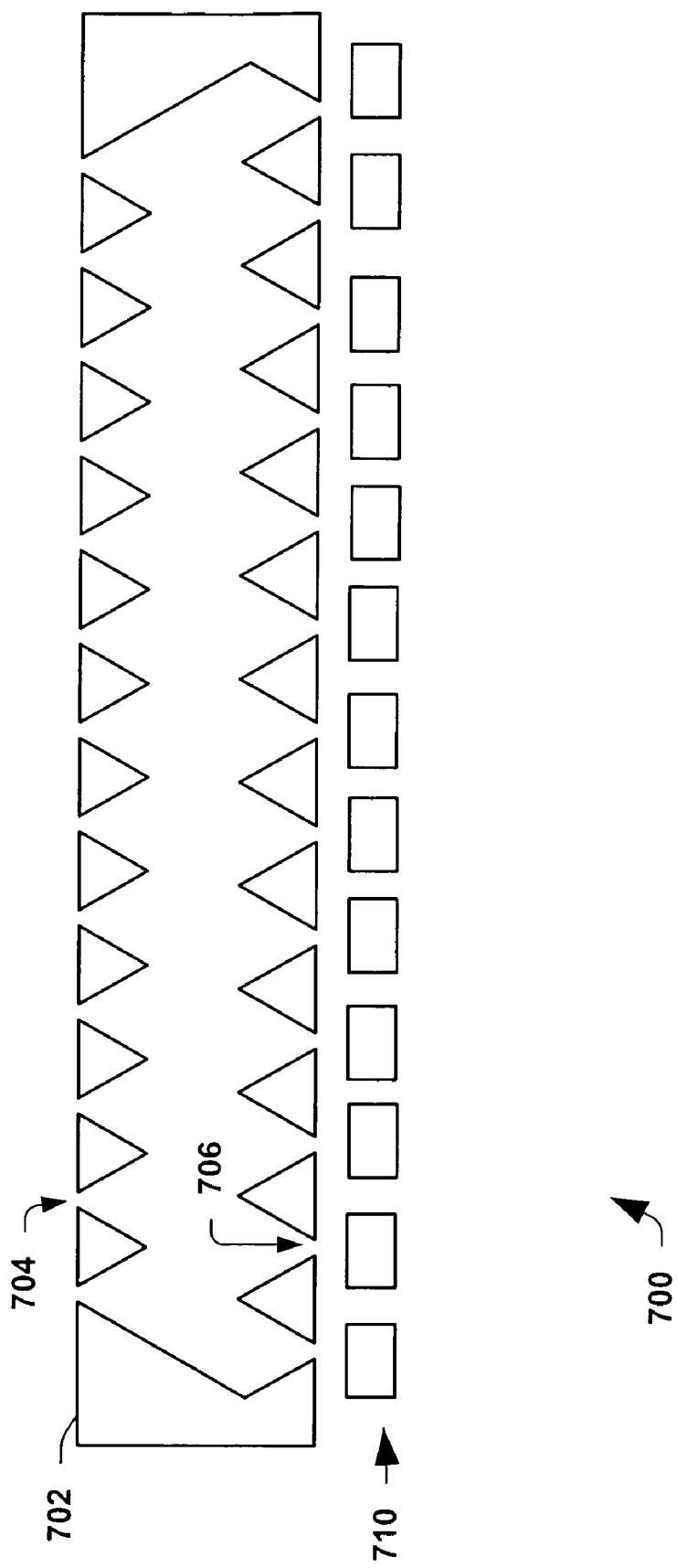
FIGS. 7A and 7B are diagrams illustrating another varied angle slot array in accordance with an aspect of the present invention.

FIG. 7A is a diagram illustrating another varied angle slot array 700 in accordance with an aspect of the present invention. A structure 702 has entrance openings or apertures 704 on an entrance surface and exit openings or apertures 706 on an exit surface. The structure can, in one example, comprise an upper plate with entrance openings 704 and a lower plate with exit openings 706. Sensors 710 are shown below or downstream of the exit openings 706 and serve to measure charge or current of beamlets that pass through the structure 702.

Each of the entrance openings 704 is associated with one of the exit openings 706. The pairs of entrance and exit openings each define a slot or region through which only ions within an acceptance range of angles can pass. Thus, the slots and acceptance range of angles are defined for each pair of openings by the size and location of the entrance opening, the size and location of the exit opening, and the distance there between.

During operation, an ion beam (not shown) impacts the varied angle slot array 700 at the entrance surface. The ion beam has an angle of incidence value and an angular distribution. Beamlets from the ion beam having suitable angles pass through one or more of the slots defined by the entrance openings 704 and the exit openings and are measured by one or more charge measuring devices 710 after passing beyond the structure 702.

Figure 7B:
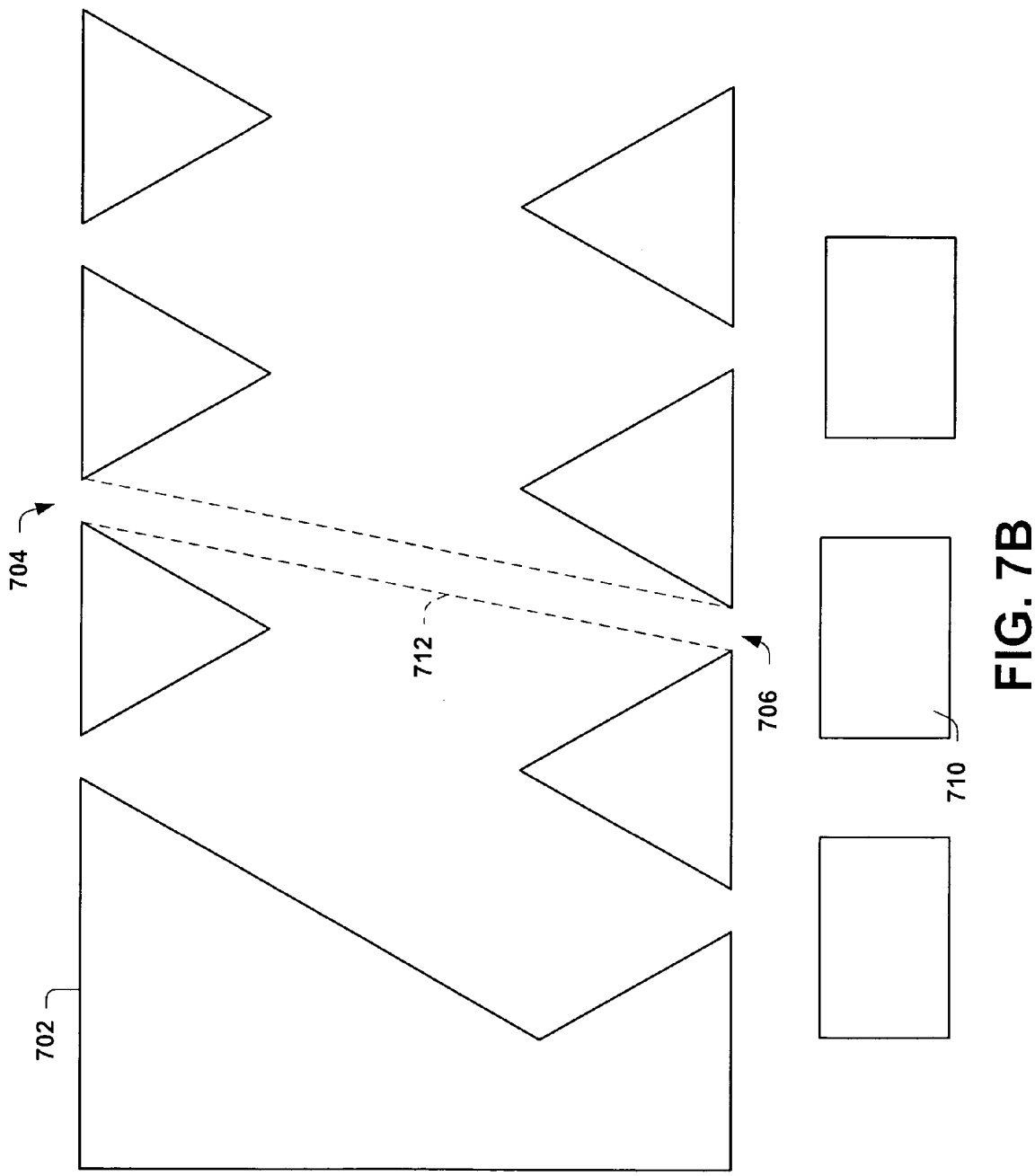

FIG. 7B is a close up view of the varied angle slot array 700 in accordance with an aspect of the present invention. This view illustrates slots defined within the structure 702 by the entrance openings 704 and the exit openings 706. Here, a slot 712 is shown between one of the entrance openings 704 and one of the exit openings 706. The slot 712 is a defined path or region through which ions having angles within the acceptance range of angles can pass. The pickup sensors 710 are also shown in this example to measure beam current or charge for ions that pass through respective slots.

FIGS. 7A and 7B show an example of yet another varied angle slot array having varied acceptance angle slots defined therein with another shape of the structure and the slots. It is appreciated that other variations in shape of the structure and slots and/or other varied configurations are contemplated by the present invention.

Figure 8:
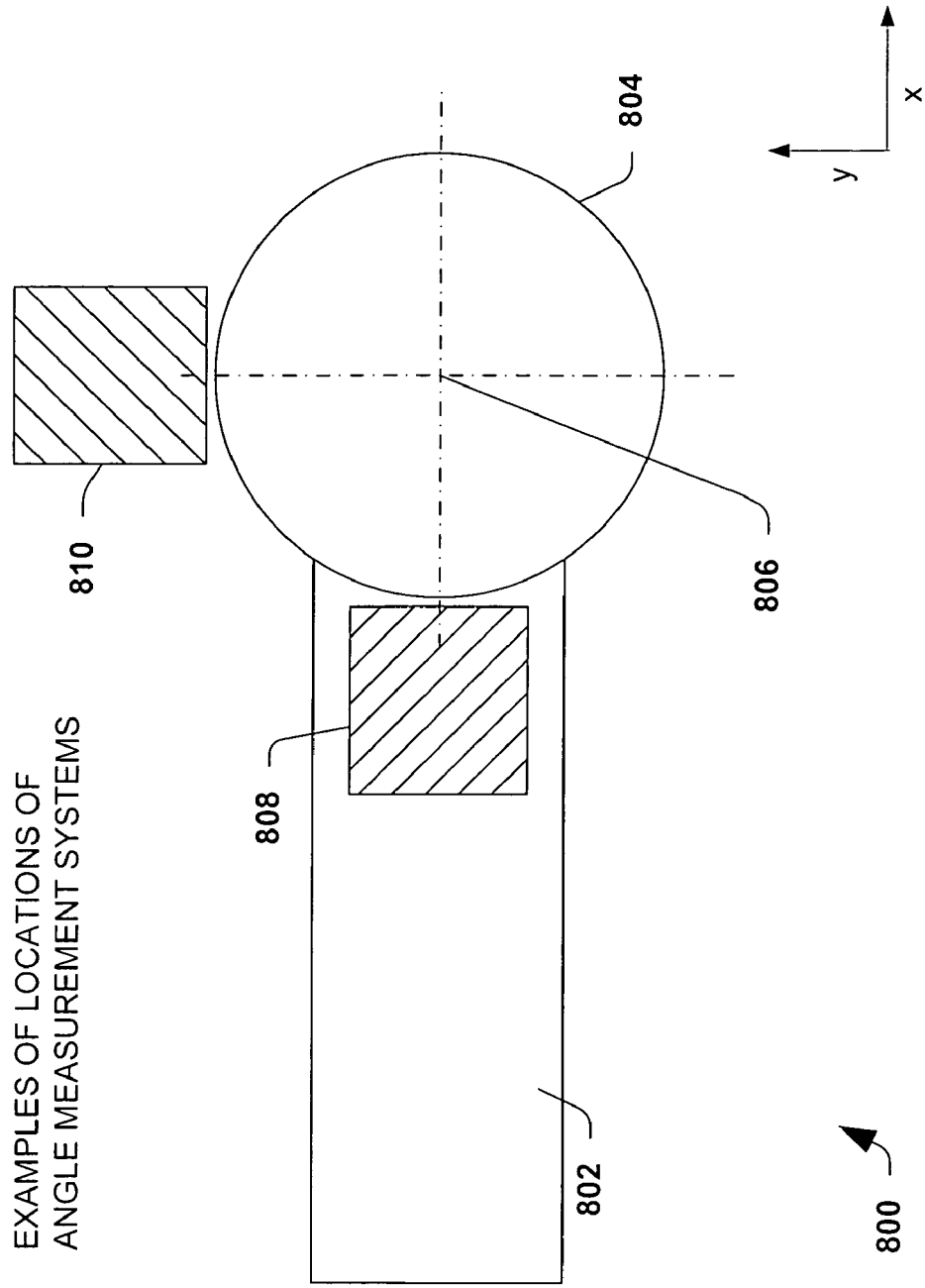
FIG. 8 is a plan view of a configuration of variable angle slot arrays on a process disk in accordance with an aspect of the present invention is illustrated.

Turning now to FIG. 8, a plan view of a configuration of single wafer end station 800 with examples of variable angle slot array locations in accordance with an aspect of the present invention is illustrated. The variable angle slot arrays permit determination of measured or actual angle of incidence values for incoming ion beams. The station 800 is provided as an example to illustrate some suitable locations for angle measurement systems containing variable angle slot arrays.

The end station 800 comprises an arm 802 that supports a single wafer 804, in this example. Generally, one or more angle measurement systems are located proximate the single wafer 804. A center point 806 of the wafer 804 is depicted to facilitate understanding of this example. Here, the end station 800 includes a first angle measurement system 808 and a second angle measurement system 810 are present and located as shown. The first angle measurement system is located on the arm 802 and to the left of the wafer 804. The second angle measurement system 810 is above the second angle measurement system 810 as shown. Both the first angle measurement system 808 and the second angle measurement system 810 are positioned on about the same plane as the wafer 804. In this example, the first angle measurement system 808 measures angles in an x direction and the second angle measurement system 810 measures angles in a y direction.

Figure 9:
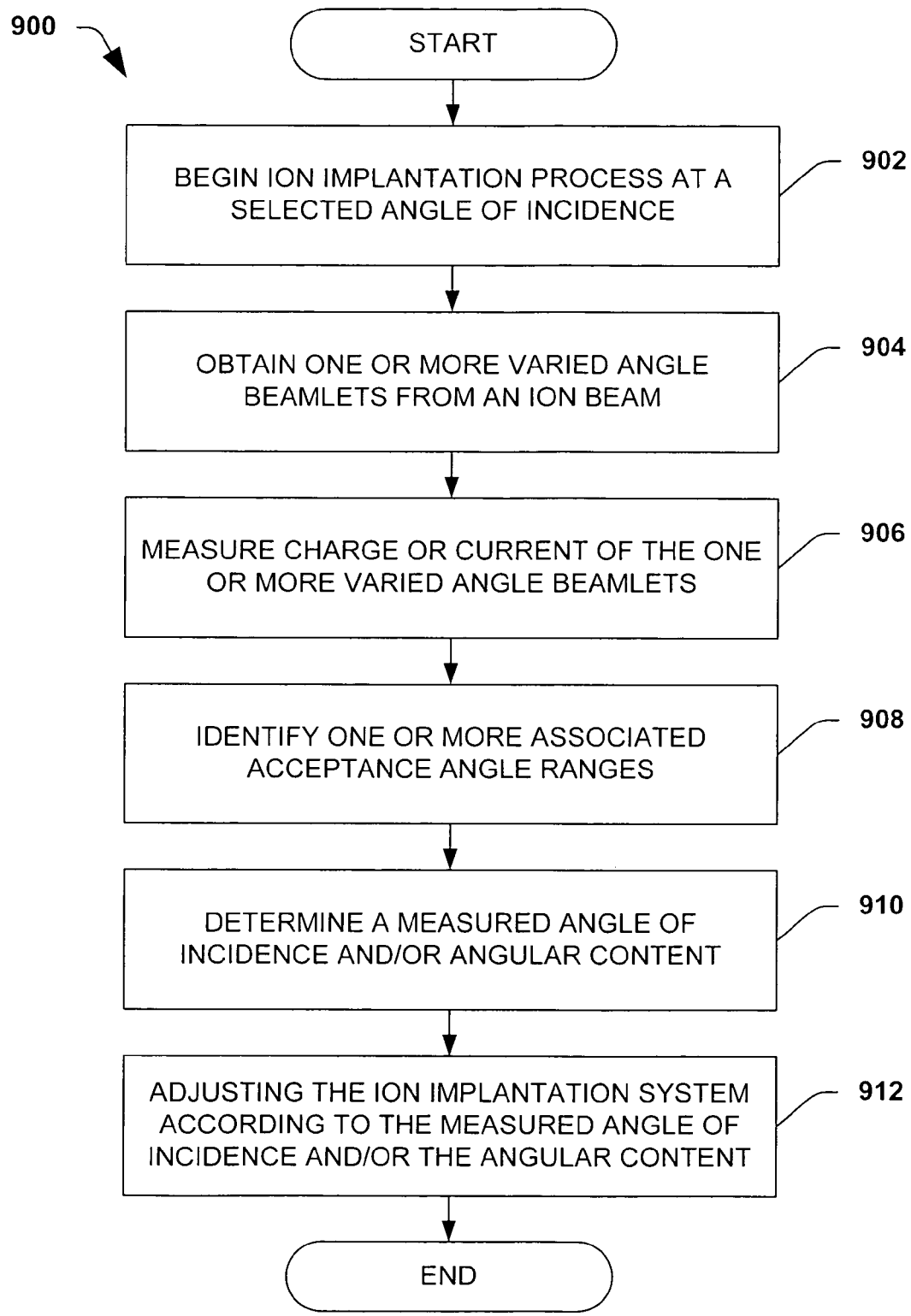
FIG. 9 is a flow diagram illustrating a method of obtaining angle of incidence values in accordance with an aspect of the present invention.

FIG. 9 is a flow diagram illustrating a method 900 of obtaining angle of incidence values in accordance with an aspect of the present invention. The method 900 can be employed for calibration and testing or to perform corrective adjustments during ion implantation processes. The method 900 is described with respect to determining angle of incidence value(s) for a single axis, but can be extended to multiple axes. For example, the method 900 can be employed to obtain angle of incidence values in a fast scan axis, and/or a slow scan axis. Additionally, the method 900 can be employed in single and/or batch ion implantation systems.

The method begins at block 902, wherein an ion implantation process is initiated in which an ion beam having a selected angle of incidence value is directed toward a target. The ion implantation process includes any number of suitable ions or dopants employing in ion implantation processes. The ion beam is generated with a selected energy and dopant concentration, for example, according to a particular fabrication process. The selected angle of incidence is typically within an operational range of the ion implantation system employed. As an example, the selected angle of incidence can be selected according to a particular fabrication process or a calibration procedure. The target can be a target wafer, such as a product wafer or test wafer, or other target for calibration purposes.

One or more varied angle beamlets are obtained from the ion beam at block 904 by employing a varied angle slot array. Examples of a suitable slot array are provided above with respect to FIG. 3 and elsewhere. The varied angle slot array comprises an array of slots formed within a structure and is positioned along a path of the ion beam. The slots have varied acceptance angle ranges which blocks ions or portions of the ion beam from passing that differ from their associated acceptance angle ranges. As a result, many of the slots will prevent any substantial amount of ions passing there through. Thus, depending upon the configuration of the array and the angular content of the ion beam, the one or more varied angle beamlets are obtained.

Continuing with the method 900 at block 906, the one or more varied angle beamlets are measured for charge or beam current. There are pickup sensors associated with each of the slots within the array that can measure charge or beam current of ions that pass there through. One or more of these pickup sensors measure the charge or beam current of the one or more varied angle beamlets.

One or more acceptance angle ranges for the one or more varied angle beamlets are identified at block 908. These ranges correspond to the particular slots through which the beamlets passed. As an example, the one or more beamlets may have passed through a first slot with an acceptance angle range of −3 to −9 degrees and a second slot with an acceptance angle range of −9 to −15 degrees.

A measured angle of incidence is determined according to the identified one or more acceptance angle ranges and the charge measurements at block 910. Additionally, an angular content or distribution can also be determined The measured angle of incidence is compared with the selected angle of incidence to determine an offset amount. If the offset amount is greater than an acceptable range, adjustments and/or corrections can be applied to the ion implantation system at block 912 to drive the measured angle of incidence toward the selected angle of incidence. Further, adjustments to the angular content or distribution can also be performed at block 912 by causing the ion implantation system to tune the ion beam.

It is appreciated that the method 900, as well as variations thereof, can be further appreciated with reference to other figures of the present invention. Additionally, the method 900 and description thereof can also be employed to facilitate a better understanding of other aspects of the invention described above.

While, for purposes of simplicity of explanation, the method 900 is depicted and described as executing serially, it is to be understood and appreciated that the present invention is not limited by the illustrated order, as some aspects could, in accordance with the present invention, occur in different orders and/or concurrently with other aspects from that depicted and described herein. Moreover, not all illustrated features or blocks may be required to implement a methodology in accordance with an aspect the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising." Additionally, the term "exemplary" is intended to indicate an example and not a best or superior aspect or implementation.

What is claimed is:

1. An ion implantation system comprising:
    an ion source that generates an ion beam;
    a beam line assembly that receives the ion beam from the ion source and processes the ion beam;
    an angle measurement system that receives the ion beam from the beam line assembly comprising:
        a varied angle slot array comprising respective slots defined within a structure and having associated acceptance angle ranges that selectively pass only portions of the ion beam having the associated acceptance angle ranges, wherein at least two of the slots have different associated acceptance angle ranges; and
        an array of charge measurement devices associated with the respective slots that measure charge for the portions of the ion beam that pass through the varied angle slot array; and
    a target location that receives the ion beam from the beam line assembly.

2. The system of claim 1, further comprising an end station located downstream of the beam line assembly, that holds a target wafer at the target location.

3. The system of claim 2, wherein the end station further comprises a process disk onto which the structure of the angle measurement system is mounted.

4. The system of claim 2, wherein the end station is a single wafer end station.

5. The system of claim 1, further comprising a controller that determines a measured angle of incidence at least partially from the measured charge for the portions of the ion beam that pass through the varied angle slot array.

6. The system of claim 1, further comprising a controller that identifies acceptance angle ranges for the portions of the ion beam that pass through the varied angle slot array and determines a measured angle of incidence value from the measured charge for the portions and the identified acceptance angle ranges.

7. The system of claim 5, wherein the beam line assembly and/or ion source adjusts an angle of incidence of the ion beam with respect to the target location according to a selected angle of incidence.

8. The system of claim 7, wherein the controller sends adjustment values to the beam line assembly on the measured angle of incidence value being varied from the selected angle of incidence value greater than a threshold amount.

9. The system of claim 5, wherein a wafer at the target location is adjusted according to the measured angle of incidence.

10. The system of claim 1, wherein the varied angle slot array further comprises an entrance surface having a convex shape and an exit surface having a concave shape.

11. The system of claim 1, wherein the varied angle slot array further comprises an entrance surface having a concave shape and an exit surface having a convex shape.

12. The system of claim 1, wherein the varied angle slot array further comprises an entrance surface having a substantially planar shape and an exit surface having a substantially planar shape.

13. The system of claim 1, further comprising a controller that determines angular content at least partially from the measured charge for the portions of the ion beam.

14. The system of claim 13, wherein the controller causes the beamline assembly and/or ion source to tune the ion beam according to the angular content.

15. The system of claim 1, wherein the structure of the varied angle slot array further comprises pairs of entrance openings on an entrance surface of the structure and exit openings on an exit surface of the structure, wherein the pairs of the entrance openings and the exit openings define the slots.

16. The system of claim 1, wherein the structure comprises a solid material with a plurality of openings formed therein that define the slots.

17. An angle measurement system for measuring an angle of incidence of an ion beam, the system comprising:
a varied angle slot array comprising slots defined within a structure from an entrance surface to an exit surface and having respective acceptance angle ranges, wherein at least two of the slots have different acceptance angle ranges; and
an array of charge measurement devices located downstream of the varied angle slot array and associated with the slots, wherein the charge measurement devices measure charge for beamlets that pass through the slots of the varied angle slot array.

18. The system of claim 17, wherein the charge measurement devices comprise pickup sensors.

19. The system of claim 18, wherein the system further comprises second structures located between the varied angle slot array and the charge measurement devices through which the beamlets pass to the charge measurement devices.

20. The system of claim 19, wherein the pickup sensors are biased to a positive value and the second structures are biased to about ground.

21. The system of claim 17, wherein the structure is comprised of a conductive material and is connected to ground.

22. The system of claim 17, wherein the structure is comprised of a material selected from the group consisting of aluminum, aluminum coated with silicon, graphite and anodized aluminum.

23. The system of claim 17, wherein the slots comprise an array of acceptance angle ranges that cover an angular distribution for an ion beam.

24. The system of claim 17, wherein the structure of the varied angle slot array comprises an upper plate having entrance openings and a lower plate having exit openings, wherein pairs of the entrance openings and the exit openings define the slots there between.

25. The system of claim 17, wherein the structure comprises a solid material with a plurality of openings formed therein that define the slots.

* * * * *